(12) United States Patent  
Adachi et al.

(10) Patent No.: US 7,635,982 B2  
(45) Date of Patent: Dec. 22, 2009

(54) MAGNETIC RESONANCE APPARATUS AND CONTROL METHOD FOR THE SAME

(75) Inventors: Kohei Adachi, Nasushiobara (JP); Kazuya Okamoto, Saitama (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/230,455

(22) Filed: Aug. 28, 2008

(65) Prior Publication Data

US 2009/0058420 A1 Mar. 5, 2009

(30) Foreign Application Priority Data

Aug. 29, 2007 (JP) ............................... 2007-222748

(51) Int. Cl.
*G01V 3/00* (2006.01)
(52) U.S. Cl. ....................................... 324/322; 324/318
(58) Field of Classification Search ......... 324/300–322; 600/407–445; 455/133; 709/220
See application file for complete search history.

(56) References Cited

U.S. PATENT DOCUMENTS 5,245,288 A 9/1993 Leussler
5,384,536 A * 1/1995 Murakami et al. .......... 324/309
6,879,878 B2 * 4/2005 Glenn et al. ................. 700/245
6,961,604 B1 * 11/2005 Vahasalo et al. ............ 600/410
7,391,214 B2 6/2008 Adachi
7,443,165 B2 * 10/2008 Varjo ......................... 324/322
2006/0206024 A1 * 9/2006 Weeks et al. ................ 600/418
2008/0246477 A1 * 10/2008 Nakabayashi ............... 324/312

FOREIGN PATENT DOCUMENTS

JP 5-261085 10/1993

OTHER PUBLICATIONS

U.S. Appl. No. 12/078,753, Kazuto Nakabayashi, filed Apr. 4, 2008.

* cited by examiner

*Primary Examiner*—Brij B Shrivastav
(74) *Attorney, Agent, or Firm*—Nixon & Vanderhye PC (57) ABSTRACT

A magnetic resonance apparatus includes a coil which receives a magnetic resonance signal from a subject, a transmitting unit which transmits the magnetic resonance signal received by the coil with a radio signal of a frequency band different from that of the magnetic resonance signal, an unit which extracts the magnetic resonance signal from the radio signal, a battery which supplies power to the transmitting unit, a switch unit which turns on and off power supply from the battery to the transmitting unit, a unit which wirelessly transmits a startup signal and a stop signal, a receiving unit which receives the startup signal and the stop signal that have been wirelessly transmitted, and a unit which controls the switch unit to turn on the power supply when the receiving unit receives the startup signal and turn off the power supply when the receiving unit receives the stop signal.

11 Claims, 7 Drawing Sheets

MAGNETIC RESONANCE APPARATUS AND CONTROL METHOD FOR THE SAME

CROSS-REFERENCE TO RELATED APPLICATIONS

This application is based upon and claims the benefit of priority from prior Japanese Patent Application No. 2007-222748, filed Aug. 29, 2007, the entire contents of which are incorporated herein by reference.

BACKGROUND OF THE INVENTION

1. Field of the Invention

The present invention relates to a magnetic resonance apparatus which wirelessly transmits a magnetic resonance signal received through a receiving coil and to a control method for the same.

2. Description of the Related Art

A receiving coil to receive a magnetic resonance signal is arranged in an image space in a gantry together with a subject. The magnetic resonance signal received by the receiving coil is transmitted to an apparatus main body through a cable connected to the receiving coil and led out from the imaging space to the outside of the gantry.

However, since the cable is obstructive, it has been proposed to transmit the magnetic resonance signal received by the receiving coil to the apparatus main body by wireless communication (see, for example, Jpn. Pat. Appln. KOKAI Publication No. 5-261085).

When the magnetic resonance signal is wirelessly transmitted as mentioned above, the receiving coil is provided with a transmitting unit and operation power for the transmitting unit is supplied from a battery.

Therefore, it is desirable to avoid waste of the battery by turning off the power of the transmitting unit when the unit is not used. However, it was troublesome to operate the switch of the transmitting unit arranged in the imaging space. Further, if this operation is not performed, the battery will be wasted, causing the problem that the battery need be recharged frequently.

BRIEF SUMMARY OF THE INVENTION

Under the circumstances, there has been a demand for reliably avoiding waste of the battery to operate the transmitting unit.

According to a first aspect of the present invention, there is provided a magnetic resonance apparatus comprising: a receiving coil which receives a magnetic resonance signal from a subject; a resonance signal transmitting unit which transmits the magnetic resonance signal received by the receiving coil with a radio signal of a frequency band different from that of the magnetic resonance signal; an extracting unit which extracts the magnetic resonance signal from the radio signal; a battery which supplies power to the resonance signal transmitting unit; a switch unit which turns on and off power supply from the battery to the resonance signal transmitting unit; a control signal transmitting unit which wirelessly transmits a startup signal indicative of startup and a stop signal indicative of stop; a receiving unit which receives the startup signal and the stop signal that have been wirelessly transmitted; and a control unit which controls the switch unit to turn on the power supply when the receiving unit receives the startup signal and turn off the power supply when the receiving unit receives the stop signal.

According to a second aspect of the present invention, there is provided a control method for a magnetic resonance apparatus comprising: a receiving coil which receives a magnetic resonance signal from a subject; a resonance signal transmitting unit which transmits the magnetic resonance signal received by the receiving coil with a radio signal of a frequency band different from that of the magnetic resonance signal; an extracting unit which extracts the magnetic resonance signal from the radio signal; a battery which supplies power to the resonance signal transmitting unit; and a switch unit which turns on and off power supply from the battery to the resonance signal transmitting unit, the method comprising: wirelessly transmitting a startup signal indicative of startup and a stop signal indicative of stop; receiving the startup signal and the stop signal that have been wirelessly transmitted; and controlling the switch unit to turn on the power supply when the startup signal is received and turn off the power supply when the stop signal is received.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the accompanying documents.

First Embodiment

Figure 1:
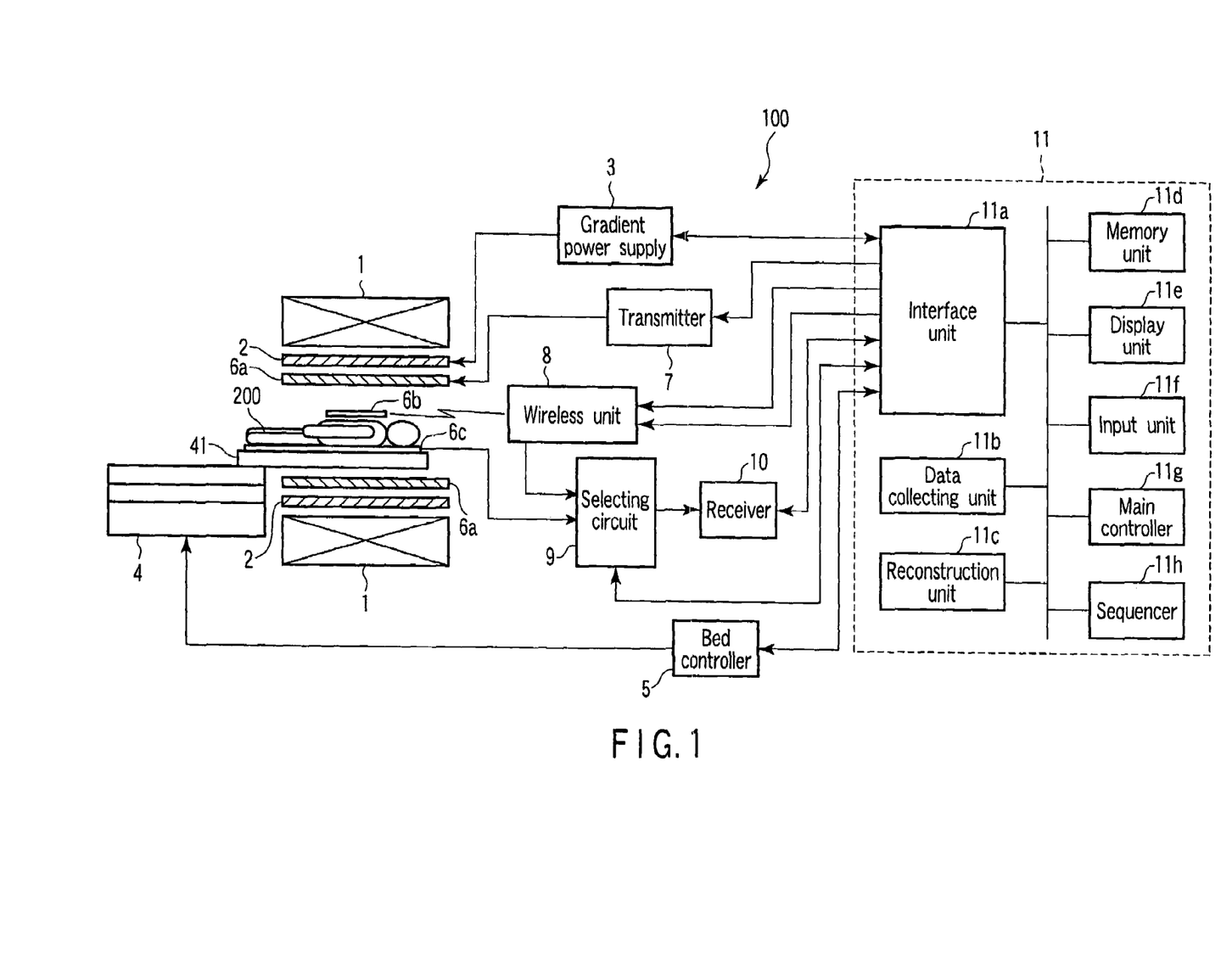
FIG. 1 is a diagram showing a configuration of a magnetic resonance apparatus according to a first embodiment of the present invention.

FIG. 1 is a diagram showing a configuration of a magnetic resonance apparatus 100 according to a first embodiment of the present invention. The magnetic resonance apparatus 100 includes a static field magnet 1, a gradient coil 2, a gradient power supply 3, a bed 4, a bed controller 5, RF coil units 6a, 6b and 6c, a transmitter 7, a wireless unit 8, a selecting circuit 9, a receiver 10 and a computer system 11.

The static field magnet 1 is formed in the shape of a hollow cylinder and adapted to generate a uniform static magnetic field within its inside space. As the static field magnet 1 use is made of a permanent magnet, a superconducting magnet, or the like.

The gradient coil 2 is formed in the shape of a hollow cylinder and placed inside the static field magnet 1. The gradient coil 2 is a combination of three coils each corresponding to a respective one of the three mutually orthogonal X, Y and Z axes. When the three coils are individually supplied with current from the gradient power supply 3, the gradient coil 2 generates gradient magnetic fields each of which has its strength varied along a corresponding one of the X, Y and Z axes. Suppose that the Z-axis direction coincides with the direction of the static magnetic field. The gradient magnetic fields in the X, Y and Z-axis directions are used as a slice selecting gradient magnetic field Gss, a phase encoding gradient magnetic field Gpe, and a readout gradient magnetic field Gro, respectively. The slice selecting gradient magnetic field Gss is used to arbitrarily determine an imaging plane section. The phase encoding gradient magnetic field Gpe is used to change the phase of magnetic resonance signals according to spatial location. The readout gradient magnetic field Gro is used to change the frequency of the magnetic resonance signals according to spatial location.

A subject 200 under examination is laid down on a top board 41 of the bed 4 and moved into the cavity (imaging space) of the gradient coil 2. The top board 41 of the bed 4 is driven by the bed controller 5 to move in its lengthwise direction (left-and-right directions in FIG. 1) and in up-and-down directions. Usually, the bed 4 is installed so that its lengthwise direction is parallel to the central axis of the static field magnet 1.

The RF coil unit 6a is constituted by one or more coils housed in a cylindrical case. The RF coil unit 6a is placed inside the gradient coil 2 and generates a radio-frequency magnetic field in response to application thereto of a radio-frequency pulse (RF pulse) from the transmitter 7.

The RF coil units 6b and 6c may be placed on the top board 41, incorporated in the top board 41 or attached to the subject 200. In imaging time, the RF coil units 6b and 6c are inserted in the imaging space together with the subject 200 and detect a magnetic resonance signal generated due to magnetic resonance that occurs in the subject. The RF coil units 6b and 6c to be mounted may be arbitrarily selected from a variety of types. The receiving coil units are not limited to two, but one or three or more receiving coil units may be mounted. The RF coil unit 6b is a unit independent of the main body of the magnetic resonance apparatus 100. The RF coil unit 6b has a function of wirelessly transmitting the detected magnetic resonance signal.

The transmitter 7 transmits RF pulses corresponding to Larmor frequency to the RF coil unit 6a.

The wireless unit 8 receives a radio signal transmitted from the RF coil unit 6b and extracts a magnetic resonance signal. The wireless unit 8 outputs the extracted magnetic resonance signal to the selecting circuit 9. Further, the wireless unit 8 wirelessly transmits a control signal to control the operation of the RF coil unit 6b.

The selecting circuit 9 selects magnetic resonance signals of one or a plurality of arbitrary channels out of the magnetic resonance signals of a plurality of channels output from the RF coil unit 6c and the wireless unit 8. The selecting circuit 9 applies the selected magnetic resonance signals to the receiver 10. What channel should be selected is instructed from the computer system 11.

The receiver 10 includes one or a plurality of channels of processing systems, each including an amplifier, a phase detector and an analog-to-digital converter. The magnetic resonance signal selected by the selecting circuit 9 is input to each of the processing systems. The amplifier amplifies the magnetic resonance signal. The phase detector detects the phase of the magnetic resonance signal output from the amplifier. The analog-to-digital converter converts the signal output from the phase detector to a digital signal. The receiver 10 outputs digital signals obtained through the respective processing systems.

The computer system 11 includes an interface unit 11a, a data collection unit 11b, a reconstruction unit 11c, a memory unit 11d, a display unit 11e, an input unit 11f, a main controller 11g and a sequencer 11h.

The interface unit 11a is connected to the gradient power supply 3, the bed controller 5, the transmitter 7, the wireless unit 8, the selecting circuit 9 and the receiver 10. The interface unit 11a allows signals to be transferred between each of these components and the computer system 11. The interface unit 11a includes interface circuits respectively corresponding to the components connected thereto. The data collection unit 11b collects digital signals output from the receiver 10 and then stores the collected digital signals, i.e., the magnetic resonance signal data, into the memory unit 11d.

The reconstruction unit 11c performs postprocessing, i.e., reconstruction, such as Fourier transforms, on the magnetic resonance signal data stored in the storage unit 11d to obtain spectrum data of desired nuclear spins within the subject 200 or image data. The reconstruction unit 11c also generates projection data in the direction of arrangement of a specific element coil designated by the main controller 11g based on the magnetic resonance signal data relating to the magnetic resonance signals received by the element coil.

The memory unit 11d stores magnetic resonance signal data and spectrum data or image data for each subject.

The display unit 11e displays a variety of information, such as spectrum data, image data, etc., under the control of the main controller 11g. As the display unit 11e there is available a display device, such as a liquid crystal display.

The input unit 11f receives a variety of commands and information input from an operator. As the input unit 11f there is available a pointing device such as a mouse or trackball, a selection device such as a mode changeover switch, or an input device such as a keyboard in accordance with the occasion.

The main controller 11g is equipped with a CPU, a memory, etc., which are not shown in the diagram and collectively controls the magnetic resonance apparatus 100. The main controller 11g has a function of controlling the operations of the RF coil unit 6b as well as the functions of controlling the respective components of the magnetic resonance apparatus to realize the conventionally known functions.

The sequencer 11h generates a pulse sequence based on imaging conditions set by the main controller 11g according to instructions of the user. The sequencer 11h controls the gradient power supply 3, the transmitter 7, the receiver 10, the data collection unit 11b, etc. so that magnetic resonance signals can be collected in accordance with the generated pulse sequence.

Figure 2:
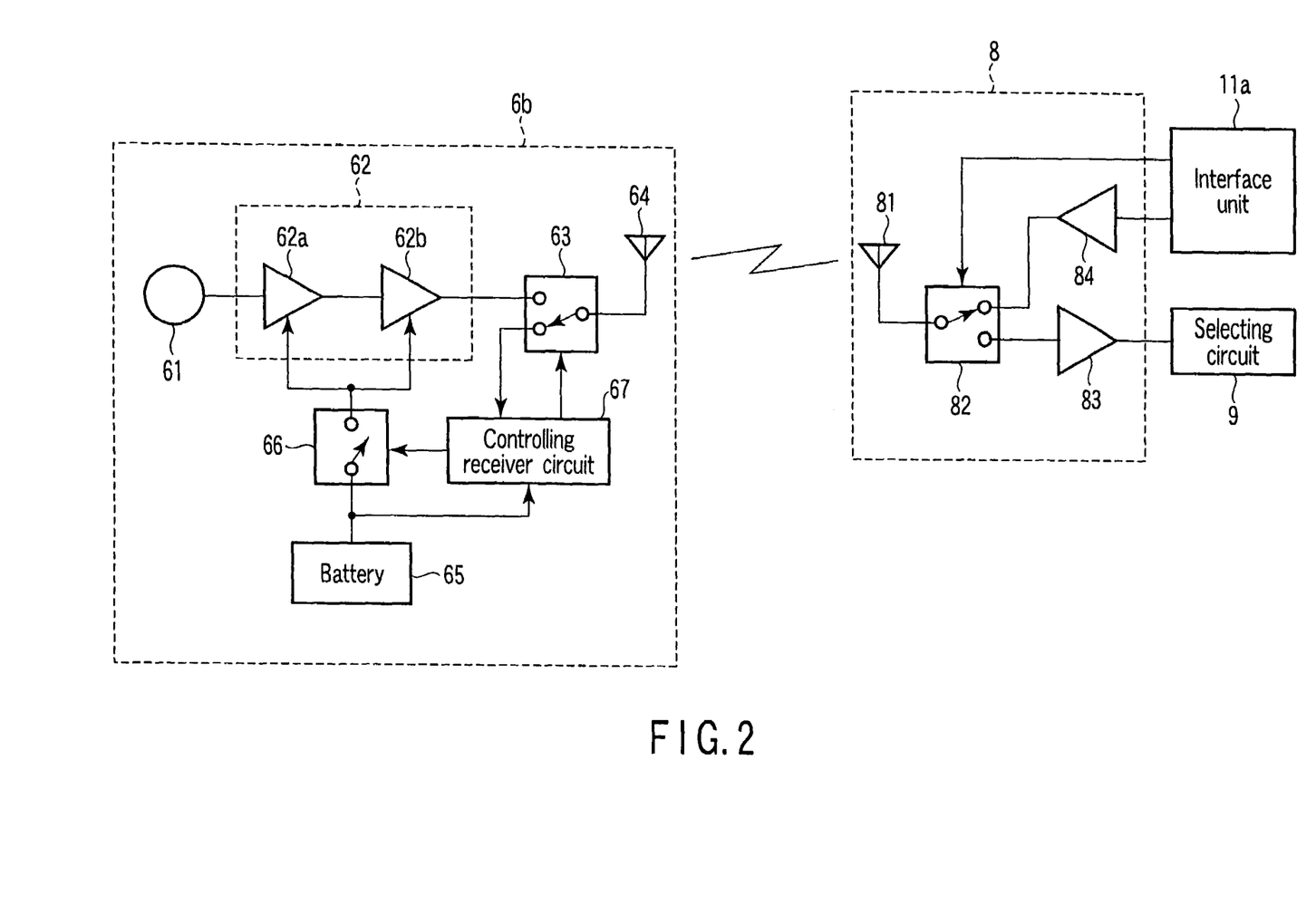
FIG. 2 is a block diagram showing specific structures of an RF coil unit and a wireless unit shown in FIG. 1.

FIG. 2 is a block diagram showing specific structures of the RF coil unit 6b and the wireless unit 8 shown in FIG. 1.

The RF coil unit 6b includes an RF coil 61, a transmitting unit 62, a transmitting and receiving switch 63, an antenna 64, a battery 65, a power supply switch 66 and a controlling receiver circuit 67.

In the RF coil 61, a magnetic resonance signal is induced by magnetic resonance in the subject 200.

The transmitting unit 62 includes an amplifier circuit 62a and a wireless transmitter circuit 62b. The amplifier circuit 62a amplifies a faint magnetic resonance signal output from the RF coil 61. The wireless transmitter circuit 62b modulates a carrier wave with the magnetic resonance signal that has been amplified by the amplifier circuit 62a, and generates a radio signal. The radio signal is supplied to the antenna 64 via the transmitting and receiving switch 63, and wirelessly transmitted. The transmitting and receiving switch 63 connects the antenna 64 to either of the transmitting unit 62 and the controlling receiver circuit 67 under the control of the controlling receiver circuit 67.

The battery 65 generates power to operate the transmitting unit 62. The battery 65 may be either a primary or secondary battery. The power supply switch 66 turns on and off the power to be supplied to the transmitting unit 62 from the battery 65 under the control of the controlling receiver circuit 67.

The controlling receiver circuit 67 receives the radio signal wirelessly transmitted from the wireless unit 8 through the antenna 64. The controlling receiver circuit 67 controls the power supply switch 66 based on a control signal contained in the received radio signal. The controlling receiver circuit 67 also controls the transmitting and receiving switch 63 to select the transmitting unit 62 during an MR signal reception period.

The wireless unit 8 includes an antenna 81, a transmitting and receiving switch 82, a wireless receiver circuit 83 and a control signal transmitter circuit 84.

The wireless receiver circuit 83 receives the radio signal transmitted from the RF coil unit 6b through the antenna 81 and the transmitting and receiving switch 82. The wireless receiver circuit 83 extracts a magnetic resonance signal from the received radio signal and outputs it to the selecting circuit 9.

The control signal transmitter circuit 84 modulates a carrier wave with a control signal applied from the main controller 11g through the interface unit 11a, and generates a radio signal. The radio signal is supplied to the antenna 81 through the transmitting and receiving switch 82, and transmitted wirelessly. The carrier wave frequency of the control signal is different from the frequency of an excitation pulse for imaging. For example, if the carrier wave frequency of the excitation pulse is 64 MHz, the carrier wave frequency of the control signal may be 20 MHz. In general, the duration of an excitation pulse is 100 μs to 100 ms.

The transmitting and receiving switch 82 connects either the wireless receiver circuit 83 or the control signal transmitter circuit 84 to the antenna 81 in response to a switch signal applied from the main controller 11g through the interface unit 11a.

In general, the so-called gantry, on which the static field magnet 1 and the gradient magnet coil 2 are mounted, is located in a shield room. On the other hand, the computer system 11 located in a machine room different from the shield room. Under this setting condition, it is desirable that the antenna 81 is mounted in the shield room, while the transmitting and receiving switch 82, the wireless receiver circuit 83 and the control signal transmitter circuit 84 are located in the machine room.

An operation of the magnetic resonance apparatus 100 having the above configuration will be described below.

In the standby state, in which imaging is not performed, the controlling receiver circuit 67 sets the power supply switch 66 in the OFF position. Therefore, the transmitting unit 62 does not operate and therefore does not consume the battery 65. In the standby state, the controlling receiver circuit 67 causes the transmitting and receiving switch 63 to select the controlling receiver circuit 67.

When it becomes necessary to perform imaging, the main controller 11g causes the transmitting and receiving switch 82 to select the control signal transmitter circuit 84, and then outputs a startup signal S1 as a control signal continuously for a predetermined time period Ta. The startup signal S1 is applied to the control signal transmitter circuit 84 through the interface section 11a and wirelessly transmitted by the control signal transmitter circuit 84 from the antenna 81.

Figure 3:
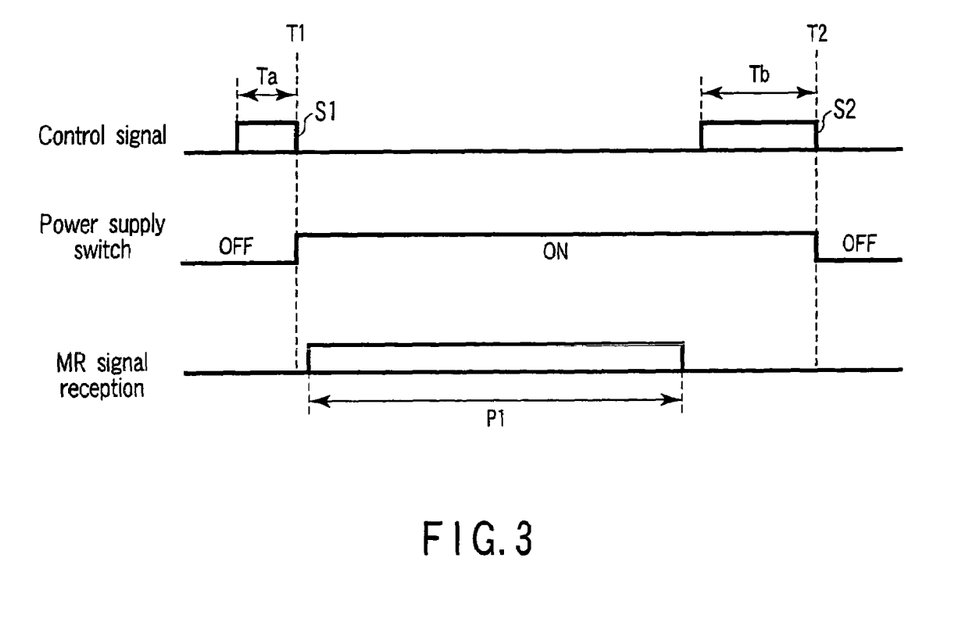
FIG. 3 is a timing chart showing states of turning on and off the power switch by means of a control signal.

The startup signal S1 wirelessly transmitted from the wireless unit 8 is received by the controlling receiver circuit 67 through the antenna 64 and the transmitting and receiving switch 63. Then, the controlling receiver circuit 67 detects that the received signal is the start up signal S1 based on the carrier wave frequency and the duration (time Ta) of the received signal. Accordingly, the controlling receiver circuit 67 turns on the power supply switch 66 as shown in FIG. 3 at the time T1. At this time, the controlling receiver circuit 67 switches the transmitting and receiving switch 63 to select the transmitting unit 62.

Thus, the power is supplied from the battery 65 to the transmitting unit 62. As a result, the amplifier circuit 62a and the wireless transmitter circuit 62b operate and the radio signal output from the wireless transmitter circuit 62b is supplied to the antenna 64. Therefore, when the magnetic resonance signal reaches the RF coil 61, the radio signal containing the magnetic resonance signal is wirelessly transmitted from the antenna 64.

In the wireless unit 8, after the startup signal S1 is transmitted, the transmitting and receiving switch 82 is switched to select the wireless receiver circuit 83. Thus, the radio signal transmitted from the RF coil unit 6b as described above is input to the wireless receiver circuit 83 through the antenna 81 and the transmitting and receiving switch 82. Then, the magnetic resonance signal is extracted from the radio signal by the wireless receiver circuit 83, and applied to the selecting circuit 9.

When the predetermined MR signal reception period P1 has elapsed, the controlling receiver circuit 67 switches the transmitting and receiving switch 63 to select the controlling receiver circuit 67. The main controller 11g causes the transmitting and receiving switch 82 to select the control signal transmitter circuit 84, and then outputs a stop signal S2 as a control signal continuously for a predetermined period of time Tb. The stop signal S2 is applied to the control signal transmitter circuit 84 through the interface section 11a and wirelessly transmitted by the control signal transmitter circuit 84 from the antenna 81.

The stop signal S2 wirelessly transmitted from the wireless unit 8 as described above is received by the controlling receiver circuit 67 through the antenna 64 and the transmitting and receiving switch 63. Then, the controlling receiver circuit 67 detects that the received signal is the stop signal S2 based on the carrier wave frequency and the duration (time Tb) of the received signal. Accordingly, the controlling receiver circuit 67 turns off the power supply switch 66 as shown in FIG. 3 at the time T2. Thus, the power supply from the battery 65 to the transmitting unit 62 is stopped. As a result, the amplifier circuit 62a and the wireless transmitter circuit 62b stop operating.

As described above, in the magnetic resonance apparatus 100, the power supply to the transmitting unit 62 is limited under the control of the main controller 11g to the period necessary for receiving the MR signal. Therefore, the waste of the battery 65 is reliably avoided.

The reception period P1 may be either an execution period for performing a single pulse sequence to receive a plurality of echo signals (1 series) or an execution period for continuously performing a plurality of pulse sequences each to receive a plurality of echo signals (1 study). In other words, the main controller 11g may transmit the startup signal S1 and the stop signal S2 respectively before and after one study, or transmit the startup signal S1 and the stop signal S2 respectively before and after each one of the series in one study.

Alternatively, the main controller 11g may transmit the startup signal S1 and the stop signal S2 respectively before and after receiving each of the echo signals in one series, while observing progress of collection of the magnetic resonance signals under the control of the sequencer 11h.

Second Embodiment

Figure 4:
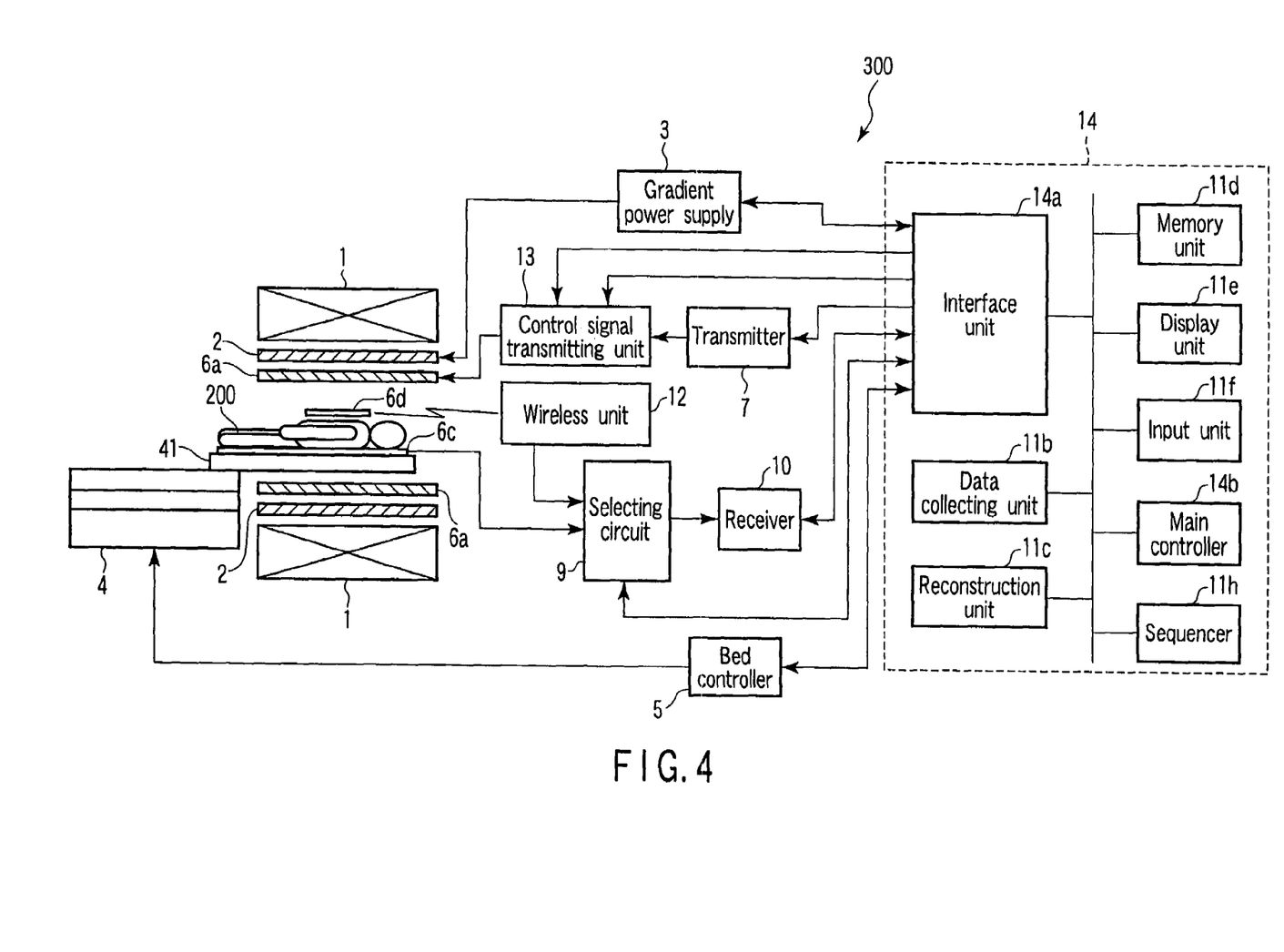
FIG. 4 is a diagram snowing a configuration of a magnetic resonance apparatus according to a second embodiment of the present invention.

FIG. 4 is a diagram showing a configuration of a magnetic resonance apparatus 300 according to a second embodiment of the present invention. In FIG. 4, the same parts as those shown in FIG. 1 are identified by the same reference symbols as those used for the first embodiment, and detailed explanations thereof are omitted.

The magnetic resonance apparatus 300 includes a static field magnet 1, a gradient coil 2, a gradient power supply 3, a bed 4, a bed controller 5, RF coil units 6a, 6c and 6d, a transmitter 7, a selecting circuit 9, a receiver 10, a wireless unit 12, a control signal transmitting unit 13 and a computer system 14. Thus, the magnetic resonance apparatus 300 comprises the RF coil unit 6d, the wireless unit 12 and the computer system 14 in place of the RF coil unit 6b, the wireless unit 8 and the computer system 11 in the magnetic resonance apparatus 100, and additionally comprises the control signal transmitting unit 13.

The RF coil unit 6d may be placed on a top board 41, incorporated in the top board 41 or attached to the subject 200. In imaging time, the RF coil unit 6d is inserted in the imaging space together with the subject 200. The RF coil unit 6d to be mounted may be arbitrarily selected from a variety of types. The receiving coil units are not limited to two, but one or three or more receiving coil units may be mounted. The RF coil unit 6d is a unit independent of the main body of the magnetic resonance apparatus 300. The RF coil unit 6d has a function of wirelessly transmitting the received magnetic resonance signal.

The wireless unit 12 receives a radio signal transmitted from the RF coil unit 6d and extracts a magnetic resonance signal. The wireless unit 12 outputs the extracted magnetic resonance signal to the selecting circuit 9. Unlike the wireless unit 8, the wireless unit 12 does not have a function of wirelessly transmitting a control signal to control the operations of the RF coil unit 6d.

The control signal transmitting unit 13 supplies a control signal to be wirelessly transmitted to control the operations of the RF coil unit 6b to the RF coil unit 6a.

The computer system 14 includes a data collection unit 11b, a reconstruction unit 11c, a memory unit 11d, a display unit 11e, an input unit 11f, a sequencer 11h, an interface unit 14a and a main controller 14b. Thus, the computer system 14 has the interface unit 14a and the main controller 14b in place of the interface unit 11a and the main controller 11b in the computer system 11.

The interface unit 14a is connected to the gradient power supply 3, the bed controller 5, the transmitter 7, the selecting circuit 9, the receiver 10 and the control signal transmitting unit 13. The interface unit 14a allows signals to be transferred between each of these components and the computer system 14.

The main controller 14b is equipped with a CPU, a memory, etc., which are not shown in the diagram and collectively controls the magnetic resonance apparatus 300. The main controller 14b has a function of controlling the operations of the RF coil unit 6d through the control signal transmitting unit 13, as well as the functions of controlling the respective components of the magnetic resonance apparatus to realize the conventionally known functions.

Figure 5:
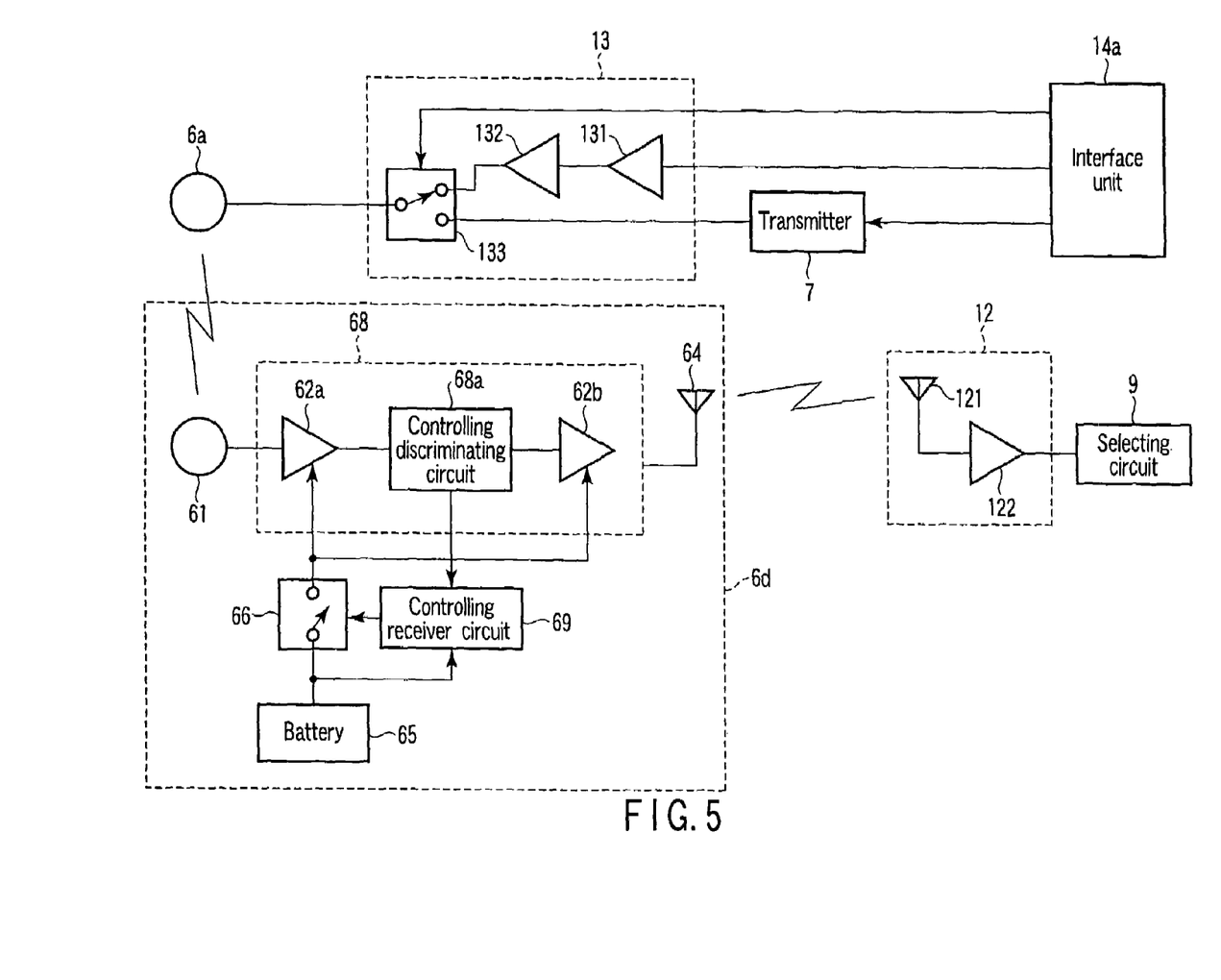
FIG. 5 is a block diagram showing specific structures of an RF coil unit, a wireless unit and a control signal transmitting unit shown in FIG. 4.

FIG. 5 is a block diagram showing specific structures of the RF coil unit 6d, the wireless unit 12 and the control signal transmitting unit 13 shown in FIG. 4. In FIG. 5, the same parts as those shown in FIG. 2 are identified by the same reference symbols as those used for the first embodiment, and detailed explanations thereof are omitted.

The control signal transmitting unit 13 includes a control signal transmitter circuit 131, a high-frequency amplifier 132 and a transmitting signal switch 133.

The control signal transmitter circuit 131 modulates a carrier wave with a control signal applied from the main controller 14b through the interface unit 14a, and generates a radio signal. The high-frequency amplifier 132 amplifies a radio signal output from the control signal transmitter circuit 131. The radio signal is supplied to the RF coil unit 6a through the transmitting signal switch 133. The carrier wave frequency of the control signal is different from the frequency of an excitation pulse for imaging.

The transmitting signal switch 133 selectively applies either the RF pulse output from the transmitter 7 or the radio signal output from the high-frequency amplifier 132. The transmitting signal switch 133 is controlled by the main controller 14b through the interface unit 14a.

The RF coil unit 6d includes an RF coil 61, an antenna 64, a battery 65, a power supply switch 66, a transmitting unit 68 and a controlling receiver circuit 69.

The RF coil 61 converts a magnetic resonance signal from an electromagnetic wave to an electric signal. The RF coil 61 also converts a radio signal transmitted from the RF coil unit 6a to an electric signal.

The transmitting unit 68 includes an amplifier circuit 62a, a wireless transmitter circuit 62b and a frequency discriminating circuit 68a. The frequency discriminating circuit 68a is inserted between the amplifier circuit 62a and the wireless transmitter circuit 62b. The frequency discriminating circuit 68a discriminates the signal output from the amplifier circuit 62a as a magnetic resonance signal or a control signal based on the frequency thereof. The frequency discriminating circuit 68a applies the magnetic resonance signal to the wireless transmitter circuit 62b and the control signal to the controlling receiver circuit 69.

The controlling receiver circuit 69 receives the control signal applied from the frequency discriminating circuit 68a. The controlling receiver circuit 69 controls the power supply switch 66 based on the received control signal.

The wireless unit 12 includes an antenna 121 and a wireless receiver circuit 122.

The wireless receiver circuit 122 receives the radio signal transmitted from the RF coil unit 6d through the antenna 121.

The wireless receiver circuit 121 extracts a magnetic resonance signal from the received radio signal and outputs it to the selecting circuit 9.

In the magnetic resonance apparatus 300 thus configured, the power supply switch 66 is turned on and off under the control of the main controller 14b in the same manner as in the magnetic resonance apparatus 100. Therefore, the waste of the battery 65 is avoided.

However, in the magnetic resonance apparatus 300, the control signal to control the power supply switch 66 is wirelessly transmitted by means of the RF coil unit 6a. Therefore, it is unnecessary to switch transmission and reception of communications between the RF coil unit 6d and the wireless unit 12.

Third Embodiment

Figure 6:
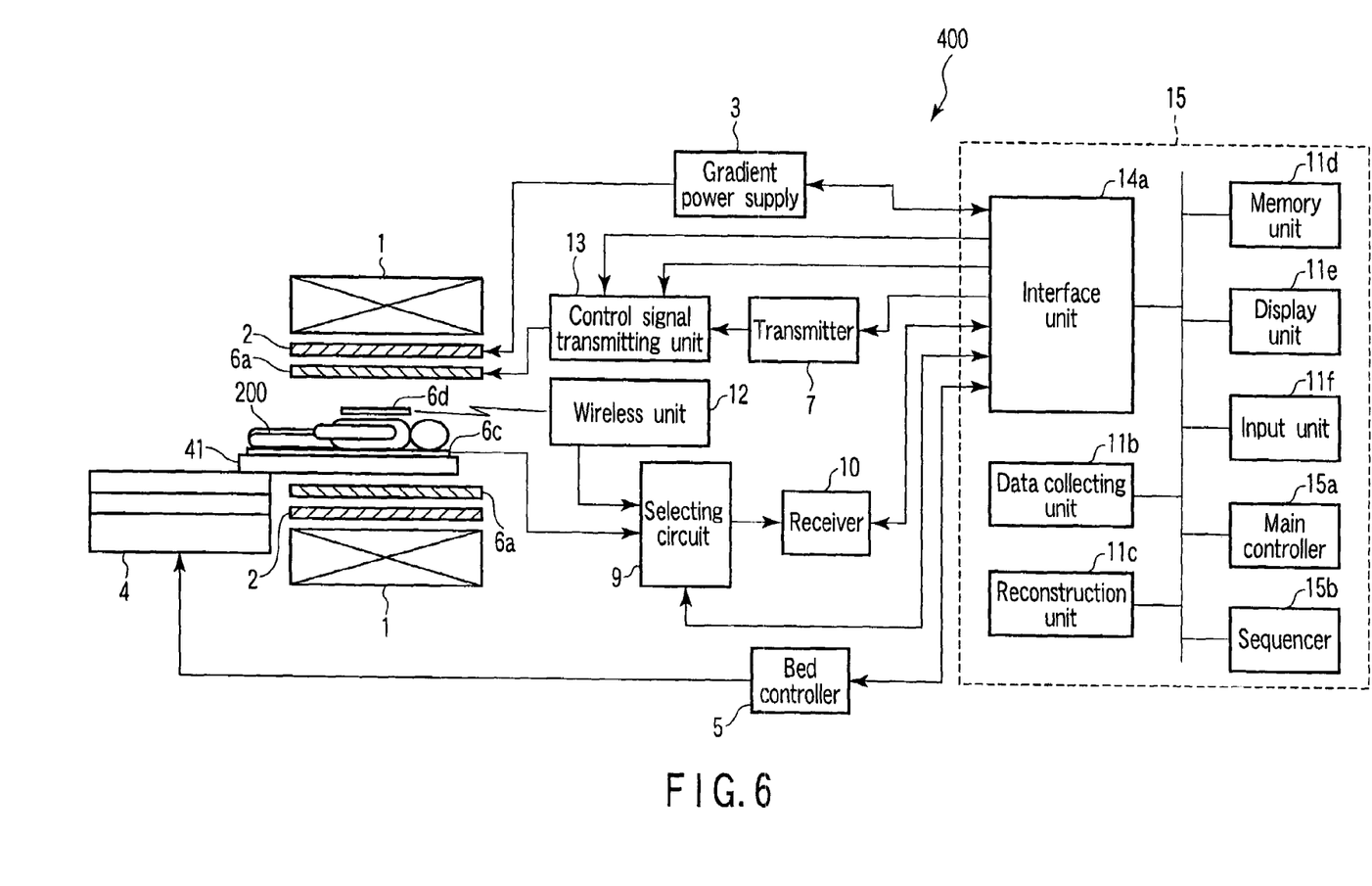
FIG. 6 is a diagram showing a configuration of a magnetic resonance apparatus according to a third embodiment of the present invention.

FIG. 6 is a diagram showing a configuration of a magnetic resonance apparatus 400 according to a third embodiment of the present invention. In FIG. 6, the same parts as those shown in FIGS. 1 and 3 are identified by the same reference symbols as those used for the first and second embodiments, and detailed explanations thereof are omitted.

The magnetic resonance apparatus 400 includes a static field magnet 1, a gradient coil 2, a gradient power supply 3, a bed 4, a bed controller 5, RF coil units 6a, 6c and 6d, a transmitter 7, a selecting circuit 9, a receiver 10, a wireless unit 12, a control signal transmitting unit 13 and a computer system 15. Thus, the magnetic resonance apparatus 300 comprises the computer system 15 in place of the computer system 14 in the magnetic resonance apparatus 300.

The computer system 15 includes a data collection unit 11b, a reconstruction unit 11c, a memory unit 11d, a display unit 11e, an input unit 11f, an interface unit 14a, a main controller 15a and a sequencer 15b. Thus, the computer system 15 has the main controller 15a and the sequencer 15b in place of the main controller 11g and the sequencer 11h in the computer system 14.

The main controller 15a is equipped with a CPU, a memory, etc., which are not shown in the diagram and collectively controls the magnetic resonance apparatus 400. The main controller 15a has the functions of controlling the respective components of the magnetic resonance apparatus to realize the conventionally known functions, but does not have a function of controlling the operations of the RF coil unit 6d.

The sequencer 15b generates a pulse sequence based on imaging conditions set by the main controller 15a according to instructions of the user. The sequencer 15b includes a control signal to control the operations of the RF coil unit 6d into the pulse sequence generated in this time. The sequencer 15b controls the gradient power supply 3, the transmitter 7, the receiver 10, the data collection unit 11b, the RF coil unit 6d, etc. so that magnetic resonance signals can be collected in accordance with the generated pulse sequence.

An operation of the magnetic resonance apparatus 400 having the above configuration will be described below.

Prior to executing one study, the main controller 15a sets imaging conditions for one series or each of a plurality of series executed in the study in accordance with the instructions of the user. The main controller 15a applies the set imaging conditions to the sequencer 15b.

Upon receipt of the imaging conditions from the main controller 15a, the sequencer 15b generates a pulse sequence for the one series or each of the plurality of series to be executed in the study based on the in accordance with. In this time, the sequencer 15b determines transmitting timing of a startup signal S1 and a stop signal S2 as a part of the pulse sequence.

As in the first embodiment, the transmitting timings of the startup signal S1 and the stop signal S2 may be before and after the study, before and after one series to be executed in the study, or before and after each one of the plurality of series to be executed in the study. However, the magnetic resonance apparatus 400 is suited to set the transmitting timings of the startup signal S1 and the stop signal S2 before and after the reception of each of a plurality of echo signals in the series.

Figure 7:
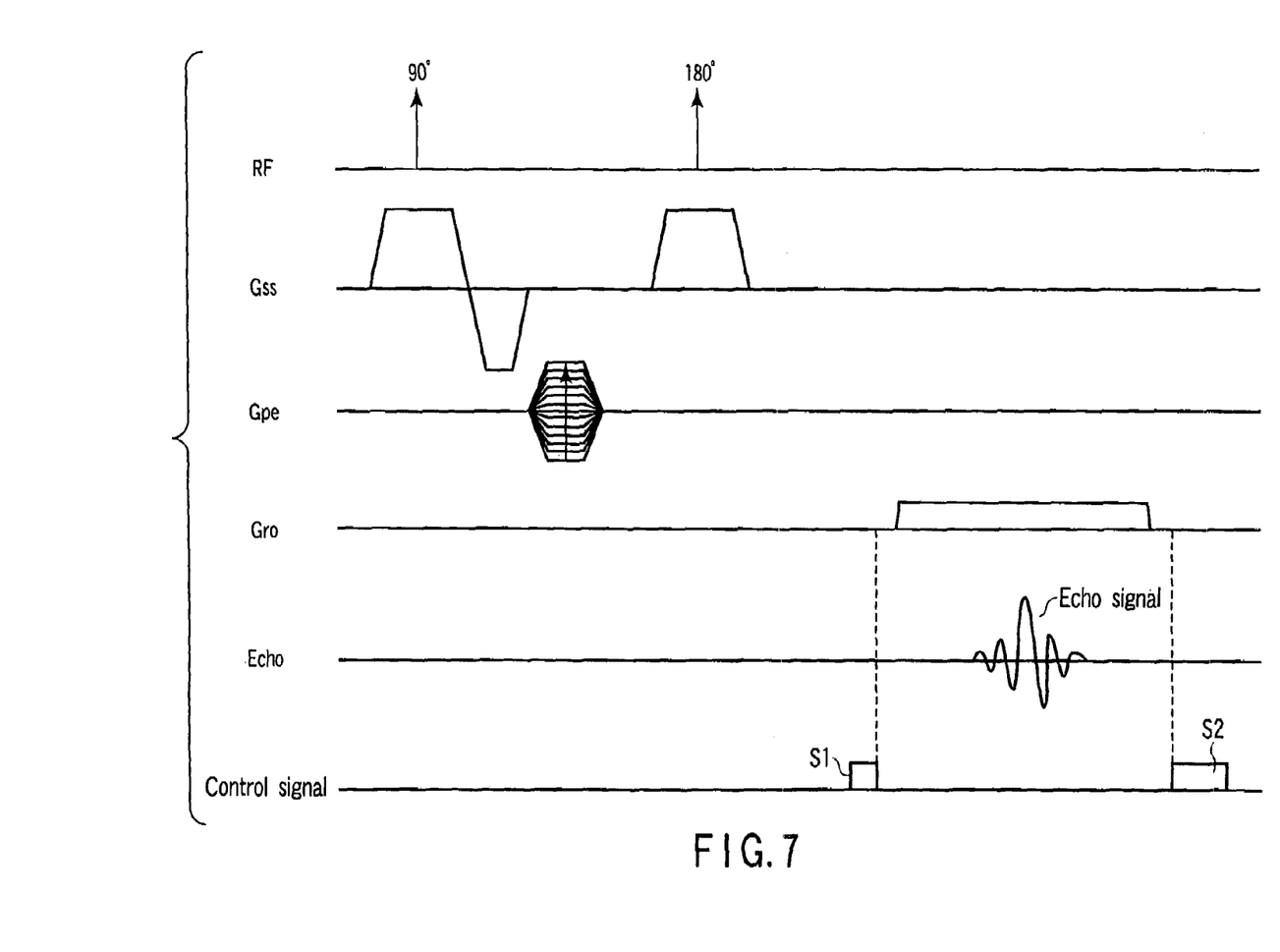
FIG. 7 is a diagram showing an example of a pulse sequence generated by a sequencer according to the spin echo method.

FIG. 7 is a diagram showing an example of a pulse sequence generated by the sequencer 15b according to the spin echo method.

The pulse sequence shown in FIG. 7 is schemed such that the startup signal S1 is transmitted before a gradient Gro for readout is generated, and the stop signal S2 is transmitted after the gradient Gro for readout is stopped.

The sequencer 15b controls the respective components of the magnetic resonance apparatus in accordance with the pulse sequence thus generated. In this time, the operations for controlling the RF coil unit 6d based on the control signal are the same as those in the second embodiment.

As described above, the magnetic resonance apparatus 400 allows control of the RF coil unit 6d integral with the control for collecting magnetic resonance signals. Therefore, the power supply switch 66 can be turned on and off at more appropriate timing in synchronism with the collection of the magnetic resonance signals.

The above embodiments may be variously modified as described below.

The RF coil units 6b and 6d may be fixed to the main body of the magnetic resonance apparatus 100, 300 or 400.

The control signal may instruct turning on and off of the power supply in accordance with the difference in frequency or amplitude. Further, the control signal may be varied in two or more of the duration, frequency and amplitude of the control signal.

In the second embodiment, the power to operate the controlling receiver circuit 69 may be extracted from the signal transmitted from the RF coil unit 6a and received by the RF coil 61.

In the RF coil units 6b and 6d, the RF coil 61 and a unit comprising the other parts of the coil unit may be separated and connected to each other by a wire.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance apparatus comprising:
   a receiving coil which receives a magnetic resonance signal from a subject;
   a resonance signal transmitting unit which transmits the magnetic resonance signal received by the receiving coil with a radio signal of a frequency band different from that of the magnetic resonance signal;
   an extracting unit which extracts the magnetic resonance signal from the radio signal;
   a battery which supplies power to the resonance signal transmitting unit;
   a switch unit which turns on and off power supply from the battery to the resonance signal transmitting unit;

a control signal transmitting unit which wirelessly transmits a startup signal indicative of startup and a stop signal indicative of stop;

a receiving unit which receives the startup signal and the stop signal that have been wirelessly transmitted; and a control unit which controls the switch unit to turn on the power supply when the receiving unit receives the startup signal and turn off the power supply when the receiving unit receives the stop signal.

2. The magnetic resonance apparatus according to claim 1, wherein the resonance signal transmitting unit comprises:

an amplifier circuit which amplifies the magnetic resonance signal received by the receiving coil; and a transmitter circuit which transmits a radio signal including the magnetic resonance signal that has been amplified by the amplifier circuit.

3. The magnetic resonance apparatus according to claim 1, further comprising an apparatus main body and a coil unit which are independent of each other, wherein;

the apparatus main body includes the extracting unit and the control signal transmitting unit; and the coil unit includes the receiving coil, the resonance signal transmitting unit, the battery, the switch unit, the receiving unit and the control unit.

4. The magnetic resonance apparatus according to claim 1, wherein the startup signal and the stop signal are distinct from each other by one of a difference in duration of an alternating signal having a predetermined signal amplitude and a difference in signal amplitude of an alternating signal.

5. The magnetic resonance apparatus according to claim 1, wherein the startup signal and the stop signal are wirelessly transmitted with a carrier wave having a frequency that is different from the frequency of the magnetic resonance signal.

6. The magnetic resonance apparatus according to claim 1, further comprising a transmitting coil which transmits an excitation pulse to excite the subject so that the magnetic resonance signal is output from the subject, wherein the control signal transmitting unit wirelessly transmits the control signal by means of the transmitting coil.

7. The magnetic resonance apparatus according to claim 1, wherein the control signal transmitting unit transmits the startup signal a predetermined time prior to a start time of a reception period in which the magnetic resonance signal is to be received, and transmits the stop signal when a predetermined time has elapsed since an end time of the reception period.

8. The magnetic resonance apparatus according to claim 7, wherein the reception period is one of a period in which an echo signal of the magnetic resonance signal is to be received, an execution period for performing a single pulse sequence to receive a plurality of echo signals of the magnetic resonance signal, and an execution period for continuously performing a plurality of pulse sequences each to receive a plurality of echo signals of the magnetic resonance signal from the subject.

9. The magnetic resonance apparatus according to claim 1, further comprising:

a transmitting coil which transmits an excitation pulse to excite the subject so that the magnetic resonance signal is output from the subject;

a power generating unit which generates power to be supplied to the control unit from a induced electromotive force that is generated in the receiving coil; and a unit which wirelessly transmits a power generating signal to make a induced electromotive force necessary for the power generating unit to generate power occur in the receiving coil by means of the transmitting coil.

10. The magnetic resonance apparatus according to claim 1, further comprising:

a static magnetic field generating unit which generates a static magnetic field;

a gradient magnetic field generating unit which generates a gradient magnetic field to be superimposed on the static magnetic field;

a pulse transmitting unit which transmits an excitation pulse to be applied to the subject;

a unit which sets an imaging condition to image the subject; and a sequence control unit which controls the gradient magnetic field generating unit and the pulse transmitting unit with a pulse sequence according to the set imaging condition, wherein:

the sequence control unit generates the startup signal and the stop signal in accordance with the pulse sequence; and the control signal transmitting unit wirelessly transmits the startup signal and the stop signal generated by the sequence control unit.

11. A control method for a magnetic resonance apparatus comprising:

a receiving coil which receives a magnetic resonance signal from a subject;

a resonance signal transmitting unit which transmits the magnetic resonance signal received by the receiving coil with a radio signal of a frequency band different from that of the magnetic resonance signal;

an extracting unit which extracts the magnetic resonance signal from the radio signal;

a battery which supplies power to the resonance signal transmitting unit; and a switch unit which turns on and off power supply from the battery to the resonance signal transmitting unit, the method comprising:

wirelessly transmitting a startup signal indicative of startup and a stop signal indicative of stop;

receiving the startup signal and the stop signal that have been wirelessly transmitted; and controlling the switch unit to turn on the power supply when the startup signal is received and turn off the power supply when the stop signal is received.

* * * * *